United States Patent
Shibo et al.

[11] Patent Number: 6,123,247
[45] Date of Patent: Sep. 26, 2000

[54] ELECTRONIC UNIT SOLDERING APPARATUS

[75] Inventors: Toshiharu Shibo, Kariya; Isao Kawaguchi, Inazawa, both of Japan

[73] Assignee: Matsushita Electric Industrial Co., Ltd., Osaka, Japan

[21] Appl. No.: 09/071,610

[22] Filed: May 1, 1998

[30] Foreign Application Priority Data

| May 8, 1997 | [JP] | Japan | 9-117839 |
| Mar. 24, 1998 | [JP] | Japan | 10-075236 |

[51] Int. Cl.[7] .......................... B23K 1/012; B23K 31/02; F27B 9/10
[52] U.S. Cl. .................. 228/46; 228/234.1; 432/121; 432/245
[58] Field of Search .............. 228/46, 8, 233.2, 228/234.1; 432/121, 245

[56] References Cited

U.S. PATENT DOCUMENTS

| 3,710,069 | 1/1973 | Papadopoulos et al. | 219/85 |
| 4,651,401 | 3/1987 | Suzuki et al. | 34/77 |
| 5,141,147 | 8/1992 | Yokota | 228/219 |
| 5,163,599 | 11/1992 | Mishina et al. | 228/42 |
| 5,345,061 | 9/1994 | Chanasyk et al. | 219/388 |
| 5,433,368 | 7/1995 | Spigarelli | 228/8 |
| 5,515,605 | 5/1996 | Hartmann et al. | 29/840 |
| 5,785,233 | 7/1998 | Nutter et al. | 228/46 |
| 5,842,627 | 12/1998 | Takanashi et al. | 228/180.1 |
| 5,993,500 | 11/1999 | Bailey et al. | 55/385.6 |

OTHER PUBLICATIONS

U.S. Patent Application No. 09/071,607, Filed May 1, 1998, Title: Electronic Unit Manufacturing Apparatus and Method, Inventor: Toshiharu Shinbo et al.

*Primary Examiner*—Patrick Ryan
*Assistant Examiner*—Kiley Stoner
*Attorney, Agent, or Firm*—Pearne & Gordon LLP

[57] ABSTRACT

An electronic unit soldering apparatus includes: a pallet on which an electronic unit to be reflow-soldered is placed; a transporting unit for transporting the pallet having the electronic unit; and a reflow furnace through which the pallet passes, the reflow furnace having: an air cooling furnace for cooling a first side of a printed-circuit board where a non-heat-resistant part is placed; and an air heating furnace for heating a second side of the printed-circuit board opposite to the first side. The pallet is placed between the cooling furnace and the electronic unit, and the pallet is a mask pallet having a hole in correspondence with a position which the non-heat-resistant part is placed.

7 Claims, 9 Drawing Sheets

ELECTRONIC UNIT SOLDERING APPARATUS

BACKGROUND OF THE INVENTION

1. Field of the Invention

This invention relates to an electronic unit soldering apparatus for reflow soldering.

2. Description of the Related Art

A conventional electronic unit soldering apparatus will be discussed. With the conventional electronic unit soldering apparatus, a printed-circuit board 3 on which a chip part 1 of a face-mounted part and a part with a lead wire 2 as a deformed part is inserted into a metal frame 4 and is dip-soldered in batch on a solder dip layer 5, as shown in FIG. 17.

The reason why dip soldering is performed is that non-heat-resistant parts such as an electrolytic capacitor and an IFT transformer of deformed parts are easily affected by light and heat; dip soldering must be performed to prevent quality degradation of the parts.

However, if such dip soldering is performed, lead wires 6 inserted into the printed-circuit board 3 are short-circuited, single-side soldering occurs in a lead wire insertion hole, or a point 7 to which no dip solder adheres occurs. The worker must correct the defects manually in a later process.

SUMMARY OF THE INVENTION

It is therefore an object of the invention to provide an electronic unit soldering apparatus for reflow soldering for protecting non-heat-resistant parts from intense heat and providing good soldering quality for lessening correction work.

To solve the above object, there is provided an electronic unit soldering apparatus including: a pallet on which an electronic unit to be reflow-soldered is placed; a transporting unit for transporting the pallet having the electronic unit; and a reflow furnace through which the pallet passes, the reflow furnace having: an air cooling furnace for cooling a first side of a printed-circuit board where a non-heat-resistant part is placed; and an air heating furnace for heating a second side of the printed-circuit board opposite to the first side. The pallet is placed between the cooling furnace and the electronic unit, and the pallet is a mask pallet having a hole in correspondence with a position which the non-heat-resistant part is placed.

BRIEF DESCRIPTION OF THE DRAWINGS

Similar reference characters denote corresponding features consistently throughout the attached drawings. The preferred embodiments of this invention will be described in detail, with reference to the following figures, wherein.

DETAILED DESCRIPTION OF THE PREFERRED EMBODIMENTS

Referring now to the accompanying drawings, there are shown preferred embodiments of the invention.

(First embodiment)

Figure 1A:
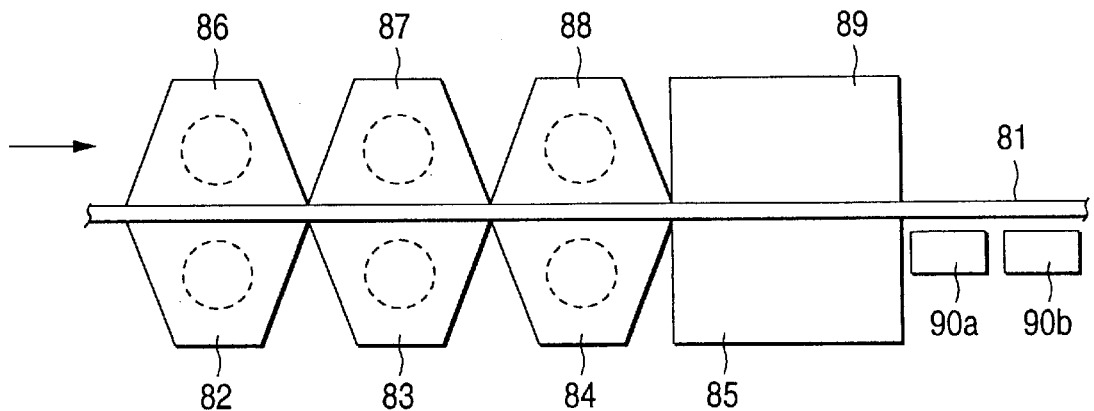
FIG. 1A is a side view of a reflow furnace in a first embodiment of the invention.
Figure 1B:
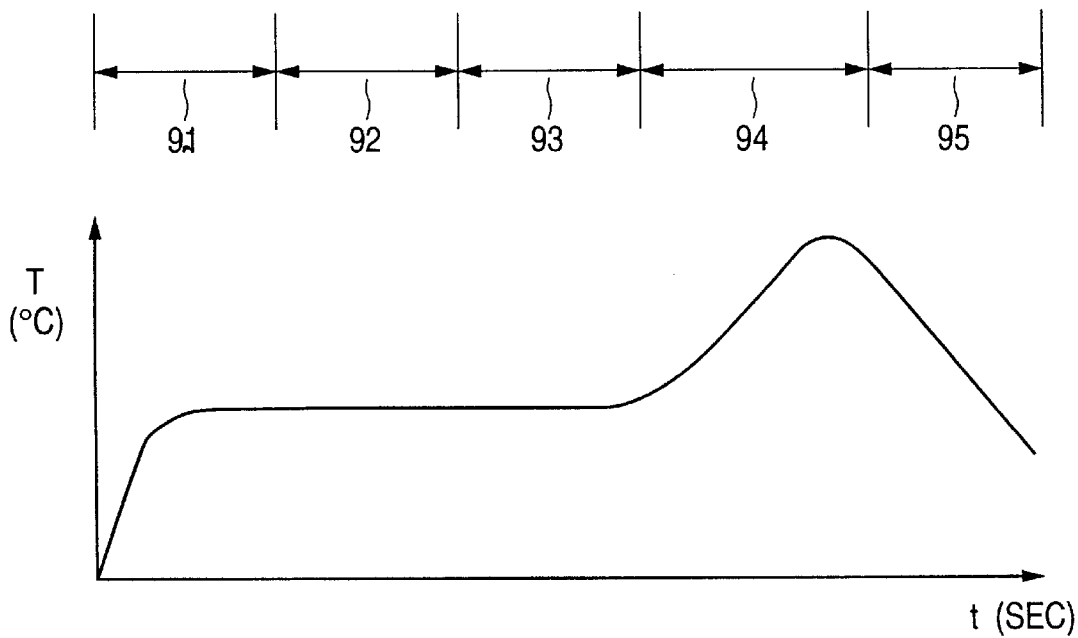
FIG. 1B is a temperature distribution chart in the reflow furnace in the first embodiment of the invention.

FIG. 1A is a side view of a reflow furnace and FIG. 1B is a temperature distribution chart in the reflow furnace. In FIG. 1A, numeral 81 is a conveyor as transporting unit on which an electronic unit (not shown) placed on a pallet (not shown) is transported. Numerals 82, 83, 84, and 85 are air heating furnaces disposed below the conveyor 81. Air cooling furnaces 86, 87, 88, and 89 are disposed above the conveyor 81 corresponding to the air heating furnaces 82, 83, 84, and 85. Numerals 90a and 90b are air heating furnaces disposed adjacent to the exit of the air heating furnaces 85. The air heating furnaces 90a and 90b are used for soldering of an input terminal of an electronic unit. The furnaces 82–89 have similar configurations. The air heating furnaces 82–84 and the air cooling furnaces 86–88 are placed at right angles to the travel direction of the conveyor 81 and the air heating furnace 85 and the air cooling furnace 89 are placed in the same direction as the travel direction of the conveyor 81. In each of the air heating furnace 85 and the air cooling furnace 89, the width of the right angle direction is about 70 cm and the length of the same direction is about 1 m. The reflow furnace temperature distribution is as shown in FIG. 1B. That is, in FIG. 1B, vertical axis T is temperature (centigrade) and horizontal axis t is time (seconds). Temperature is raised for preheating an electronic unit at time 91 which the electronic unit passes through the first furnace made up of the air heating furnace 82 and the air cooling furnace 88. Next, the preheating temperature is held at time 92 which the electronic unit passes through the second furnace made up of the air heating furnace 83 and the air cooling furnace 87. Likewise, the preheating temperature is held at time 93 which the electronic unit passes through the third furnace made up of the air heating furnace 84 and the air cooling furnace 88. At time 94 which the electronic unit passes through the fourth furnace made up of the air heating furnace 85 and the air cooling furnace 89, the temperature on the side of a printed-circuit board (not shown) where chip parts (being heat-resistant and face-mounted parts) are placed is set to high temperature, reflow soldering is performed, and deformed parts (non-heat-resistant parts typified by an electrolytic capacitor, an IFT transformer, etc.,) easily affected by temperature, placed to the opposite side of the printed-circuit board is cooled by the air cooling furnace 89 for protecting the deformed parts. After this, in the air heating furnaces 90*a* and 90*b* used for soldering of an input terminal (connector) placed on the frame of the electronic unit, the input terminal is soldered to the frame during time 95.

Figure 2:
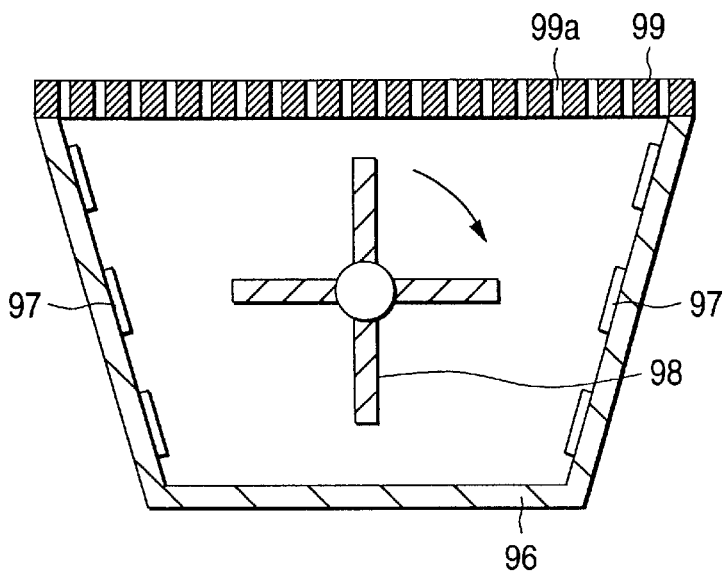
FIG. 2 is a sectional view of an oven forming a part of the reflow furnace in the first embodiment of the invention.

FIG. 2 is a sectional view of the furnace 82–89. In the figure, numeral 96 is an oven opened on one side. The oven 96 has sides widening toward the opening and a heater 97 is disposed on each of the sides. An agitating fan 98 is provided at the substantially center of the oven 96. Numeral 99 is a rectification plate disposed on the opening of the oven 96 and holes 99*a* are made in the rectification plate 99 like a lattice. Therefore, air heated by the heaters 97 is agitated by the fan 98 and is passed through the holes 99*a* of the rectification plate 99, then becomes hot air rectified in one direction. The hot air temperature is controlled by the heaters 97. The air cooling furnaces differ from the air heating furnaces only in control temperature and have the same configurations as the air heating furnaces.

Figure 3:
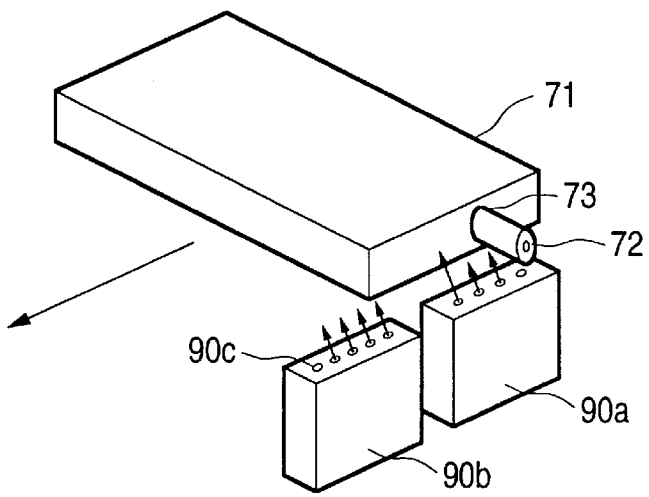
FIG. 3 is a perspective view of the neighborhood of air heating furnaces dedicated to soldering of an input terminal connector in the reflow furnace in the first embodiment of the invention.

FIG. 3 shows the air heating furnaces 90*a* and 90*b* for fusing and fixedly securing cream solder 73 applied to the root of an input terminal 72 placed on a frame 71 of an electronic unit. Hot air ranging from 230 to 260 degrees is jetted from linearly arranged holes 90*c* of the air heating furnaces 90*a* and 90*b*.

Figure 4:
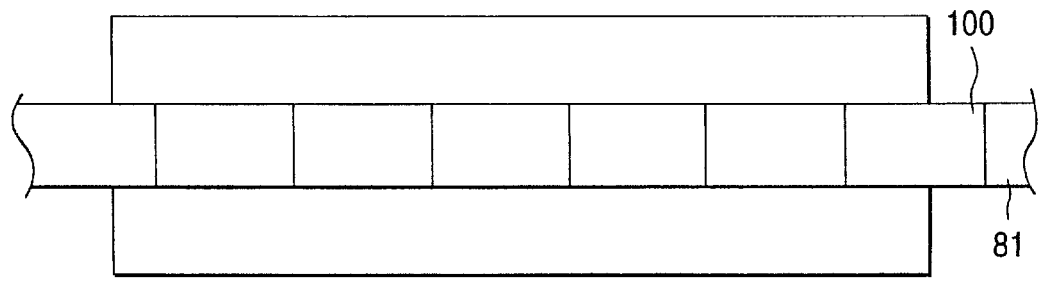
FIG. 4 is a plan view of the neighborhood of a conveyor in the reflow furnace in the first embodiment of the invention.

FIG. 4 is a plan view of the neighborhood of the conveyor 81 in the reflow furnace. Numeral 100 is a pallet transported on the conveyor 81. The pallets 100 flow continuously in the reflow furnace as shown in FIG. 4. Therefore, the air heating furnaces 82–85 and the air cooling furnaces 86–89 are separated thermally by the pallets 100, so that they can be controlled in temperature separately and temperature setting is facilitated.

Figure 5:
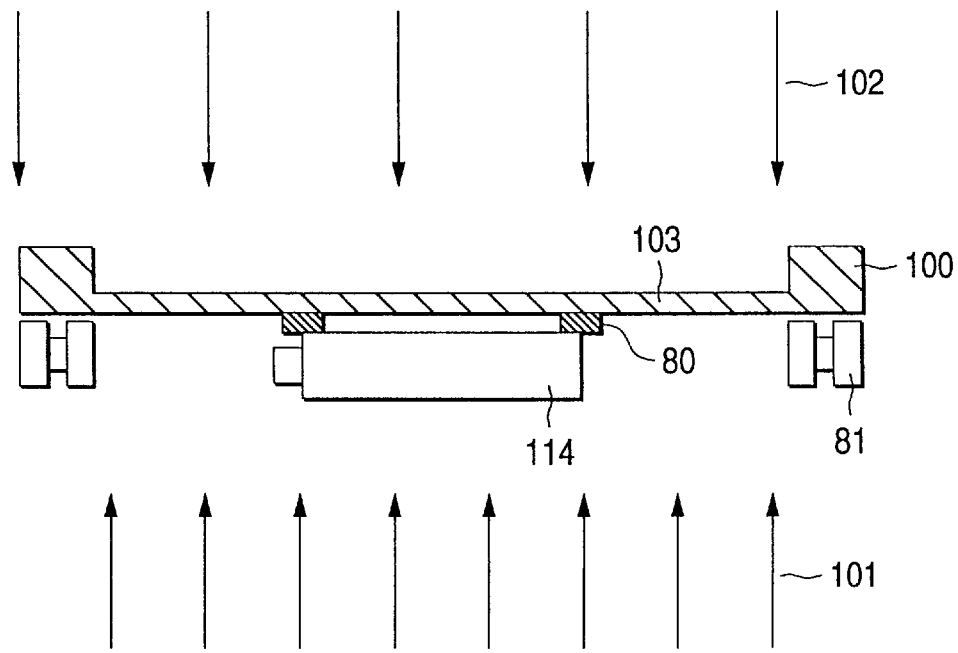
FIG. 5 is a sectional view of the neighborhood of the conveyor in the reflow furnace in the first embodiment of the invention.

FIG. 5 is a sectional view of the neighborhood of the pallet 100 in the reflow furnace. In the figure, numeral 81 is the conveyor. The pallet 100 is placed on the conveyor 81 and is transported. It has a bottom 103 forming a mask pallet in which holes are made, as described later. Numeral 114 is an electronic unit attracted detachably to the mask pallet 103 by a magnet 80. Numeral 101 is hot air and numeral 102 is cold air. The hot air 101 and the cold air 102 are separated by the mask pallet 103, as shown in FIG. 5, so that temperature control at the reflow time can be easily performed.

Figure 6:
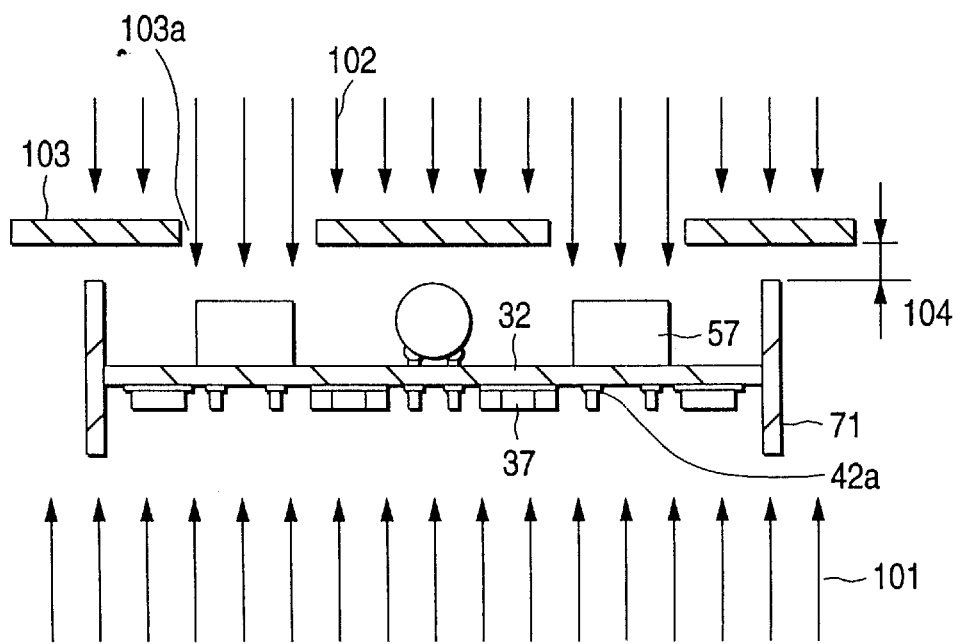
FIG. 6 is a sectional view of the main part of the reflow furnace in the first embodiment of the invention.
Figure 7:
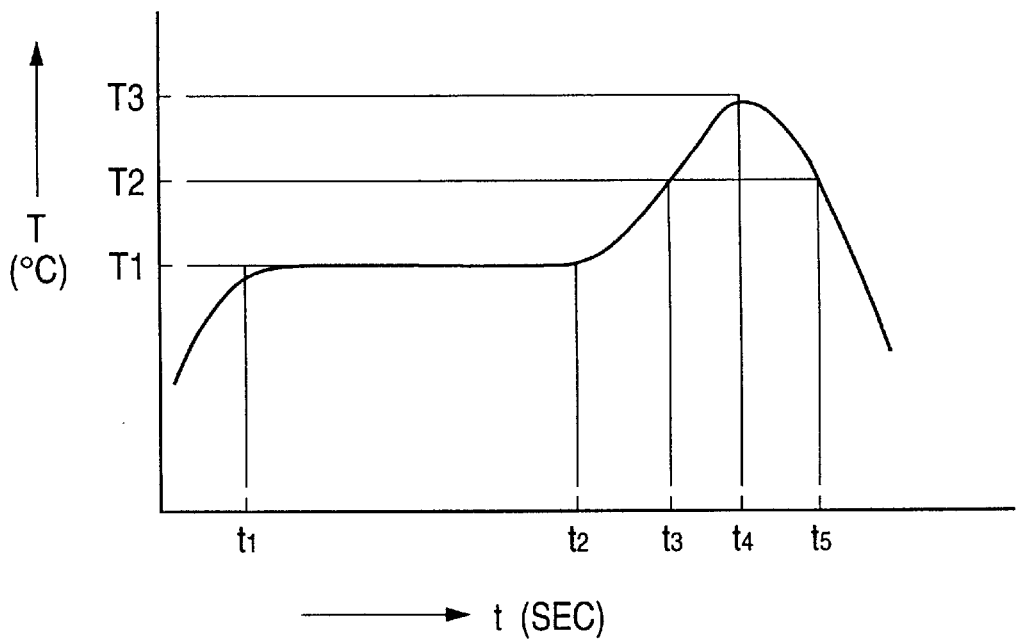
FIG. 7 is a temperature distribution chart in the reflow furnace in the first embodiment of the invention.

FIG. 6 is a sectional view of the main part of the reflow furnace. In the figure, numeral 71 is the frame of the electronic unit and numeral 32 is a printed-circuit board placed in the frame 71. Chip parts 37 and deformed parts (a coil, an IFT transformer, a Mylar capacitor, lead wires, etc.,) are placed on the printed-circuit board 32. The hot air 101 at temperature 420–450 degrees is applied to one side of the printed-circuit board 32 where the chip parts 37 are placed and cold air 102 at about 90 degrees is jetted onto the opposite side of the printed-circuit board 32 where the deformed parts are placed. Numeral 103 is the mask pallet for shutting off the cold air 102. The mask pallet 103 is made of stainless steel having about 1 mm thickness. The mask pallet 103 may be made of heat-resistant material which is not oxidized. Numeral 103*a* is a hole made in the mask pallet 103. The cold air 102 is passed through the holes 103*a* for cooling the deformed parts, such as an electrolytic capacitor and an IFT transformer, easily affected by intense heat, whereby even parts easily affected by intense heat can be reflow-soldered with good quality. Above the high thermal conductivity parts (a coil, lead wires, a Mylar capacitor, etc.,), the metal frame 71, and a metal partition plate 71*c*, inflow of the cold water 102 is shut off by the mask pallet 103, because if the cold air 102 is applied to the parts having high thermal conductivity, the side of the printed-circuit board 32 where the chip parts 37 are placed is also cooled due to the high thermal conductivity, whereby reflow heat is taken and good soldering cannot be executed. It is important to make a gap 104 (about 3 mm) between the frame 71 and the mask pallet 103 so that the mask pallet 103 does not take heat of the frame 71 or the partition plate 71*c*. FIG. 7 shows temperature change on the chip part 37 placement side of the printed-circuit board 32 on the hot air 101 side. In the figure, vertical axis T is temperature (centigrade) and horizontal axis t is time (seconds). First, temperature T1 for about 90 seconds between t1 and t2 is held 100–160 degrees and temperature T2 for about 20 seconds between t3 and t5 is held 200 degrees or more. At this time, the highest temperature T3 is 220–240 degrees. The deformed parts (for example, 57) are fixedly secured reliably to the printed-circuit board 32 with cream solder 42*a* by performing such temperature control. The chip parts 37 are also fixedly secured reliably to the printed-circuit board 32. Thus, the deformed parts easily affected by intense heat can be protected reliably and the soldering quality of the chip part 37 side of the printed-circuit board 32 can be held good.

Figure 8:
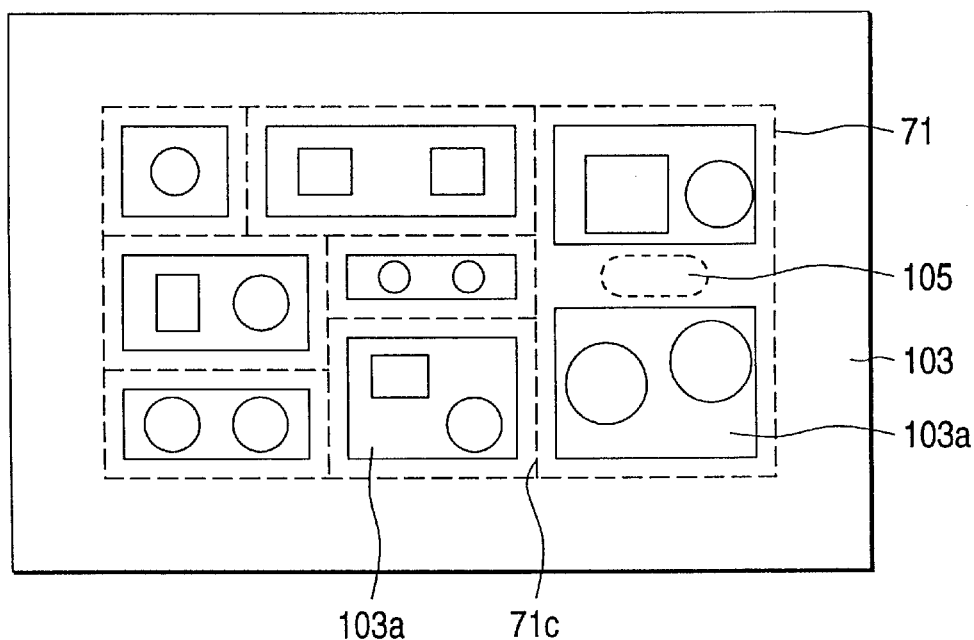
FIG. 8 is a plan view of a mask pallet in the reflow furnace in the first embodiment of the invention.

FIG. 8 is a plan view of the mask pallet 103. Numeral 71 is the frame, as indicated by the dash line and numeral 71*c* is the partition plate. Numeral 103*a* is the hole for sending cold air to deformed parts easily affected by intense heat. Numeral 105 is a part having high thermal conductivity, typified by a Mylar capacitor or a coil. Thus, the mask pallet 103 protects deformed parts easily affected by intense heat from reflow heat and shuts off applying cold air to parts having high thermal conductivity for maintaining good soldering quality.

Figure 9:
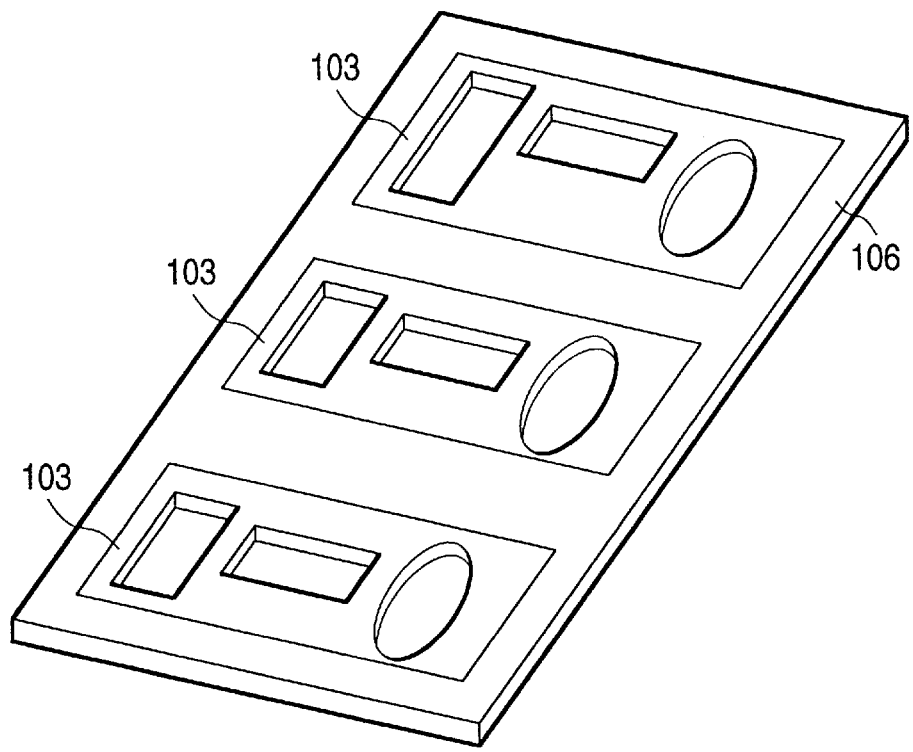
FIG. 9 is a perspective view of a cold air shielding plate formed with mask pallets in the reflow furnace in the first embodiment of the invention.

FIG. 9 shows one cold air shielding plate 106 formed with three mask pallets 103. A plurality of mask pallets 103 is thus formed on one cold air shielding plate 106, whereby productivity can be improved.

(Second embodiment)

Figure 10:
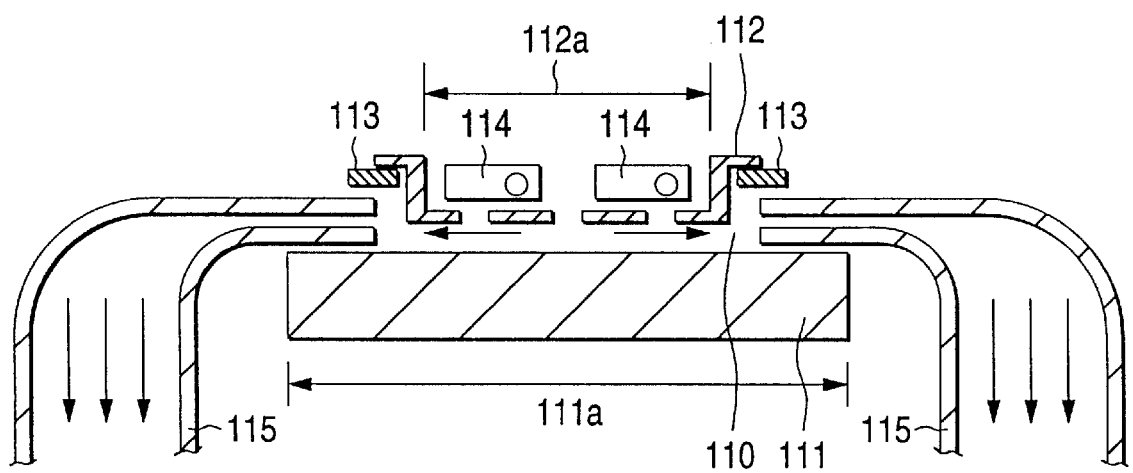
FIG. 10 is a sectional view of the main part of a thermal furnace forming a part of a reflow furnace in a second embodiment of the invention.

FIG. 10 is a sectional view of the main part of a thermal furnace forming a part of a reflow furnace in a second embodiment of the invention. In the figure, numeral 111 is an infrared heater. A mask pallet 112 is placed via a gap 110 about 2 mm above the infrared heater 111 so that the mask pallet 112 can be transported on a conveyor 113. Electronic units 114 are placed in the mask pallet 112. The electronic units 114 are the same as those described in the first embodiment.

Heat absorption ducts 115 extend from both ends of the gap 110 between the infrared heater 111 and the mask pallet 112 for absorbing heat from the infrared heater 111 to control temperature in the furnace. The heat absorption ducts 115 can be thus used to control the temperature in the furnace for protecting deformed parts of non-heat-resistant parts. In the second embodiment, the need for air cooling furnaces is eliminated and cost reduction is enabled. The infrared heater 111 has a width 111*a* of about 480 mm and the mask pallet 112 has a width 112*a* of about 280 mm. Since the width 111*a* of the infrared heater 111 is about twice the width 112*a* of the mask pallet 112, uniform heat can be applied to the mask pallet 112.

Figure 11:
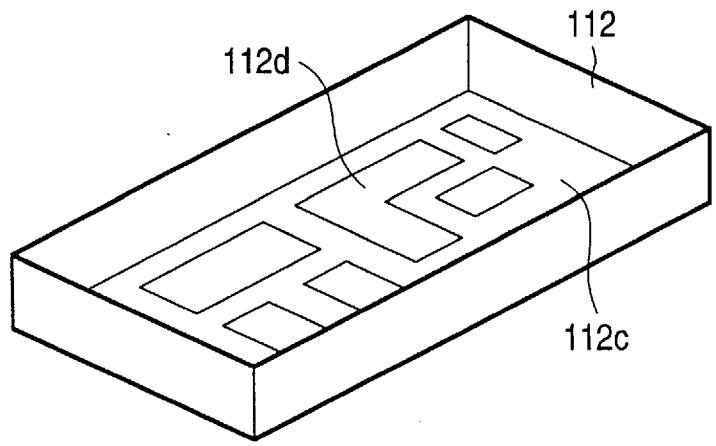
FIG. 11 is a perspective view of a pallet in the reflow furnace in the second embodiment of the invention.

FIG. 11 is a perspective view of the mask pallet 112. As shown here, a plurality of holes 112*d* are made in a bottom 112*c* of the mask pallet 112. The holes 112*d* are made corresponding to the positions of heat-resistant parts on a printed-circuit board 32, facilitating fusing of cream solder on the heat-resistant parts. That is, the side of the printed-circuit board 32 corresponding to the holes 112*d* becomes higher temperature than the opposite side, so that temperature difference control between heat-resistant and non-heat-resistant parts is furthermore facilitated. Here, chip parts as face-mounted parts are classified into heat-resistant parts, an electrolytic capacitor, an IFT transformer, and the like of deformed parts are classified into non-heat-resistant parts, and a Mylar capacitor, a coil, and the like are classified into high-thermal-conductivity parts.

Figure 12:
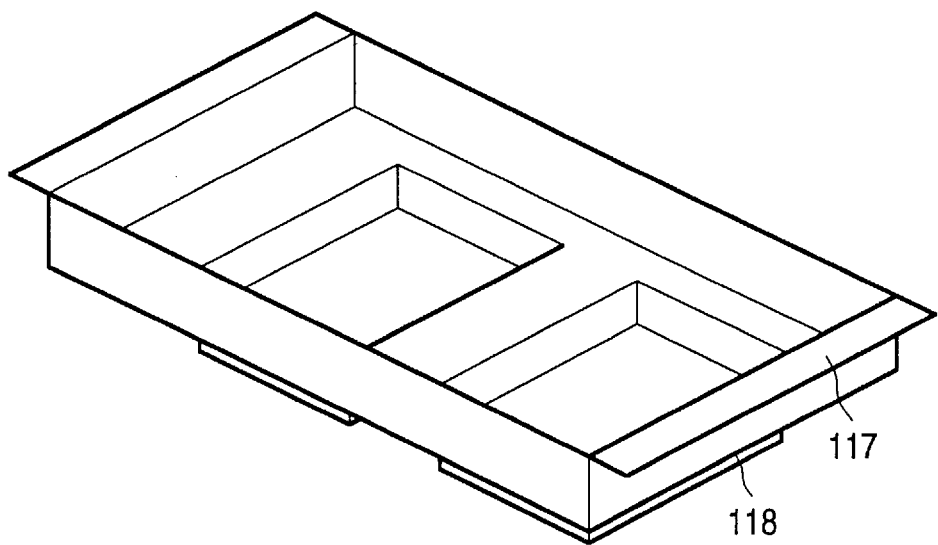
FIG. 12 is a perspective view of another example of a pallet in the reflow furnace in the second embodiment of the invention.
Figure 13:
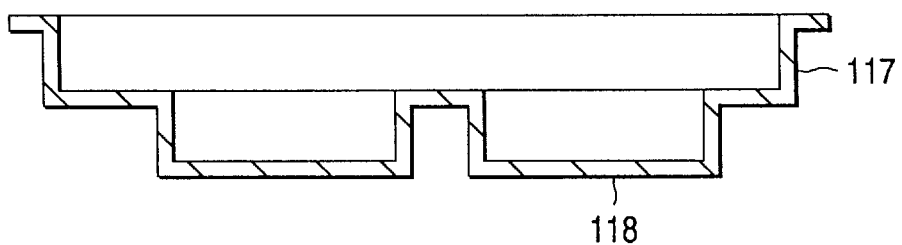
FIG. 13 is a sectional view of the pallet in FIG. 12 in the reflow furnace in the second embodiment of the invention.

FIG. 12 is a perspective view of another example of a pallet. FIG. 13 is a sectional view of the pallet in FIG. 12. In the example shown in the figures, two concave parts 118 are furthermore formed in the bottom of the pallet 117 and holes through which hot air passes are made in the bottoms of the concave parts 118, forming a mask pallet. The two concave parts 118 are made for reflow-soldering two electronic units 114 at a time. The pallet 117 uses a stainless material having 1.0 mm thickness. If the thickness is less than 1.0 mm, the pallet strength cannot be maintained. However, with the stainless material 1.0 mm thick, reflow heat is taken and good soldering cannot be executed, thus a stainless material 0.5 mm thick is used for the concave part 118 where the electronic unit 114 is placed to lessen the taken heat quantity for enabling good soldering.

Figure 14A:
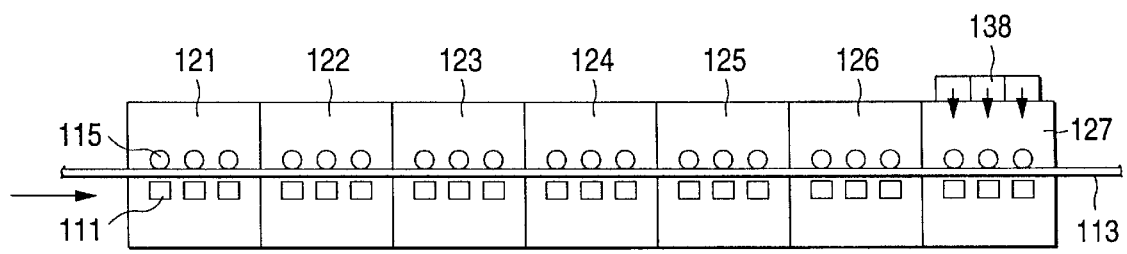
FIG. 14A is a side view of a reflow furnace in the second embodiment of the invention.
Figure 14B:
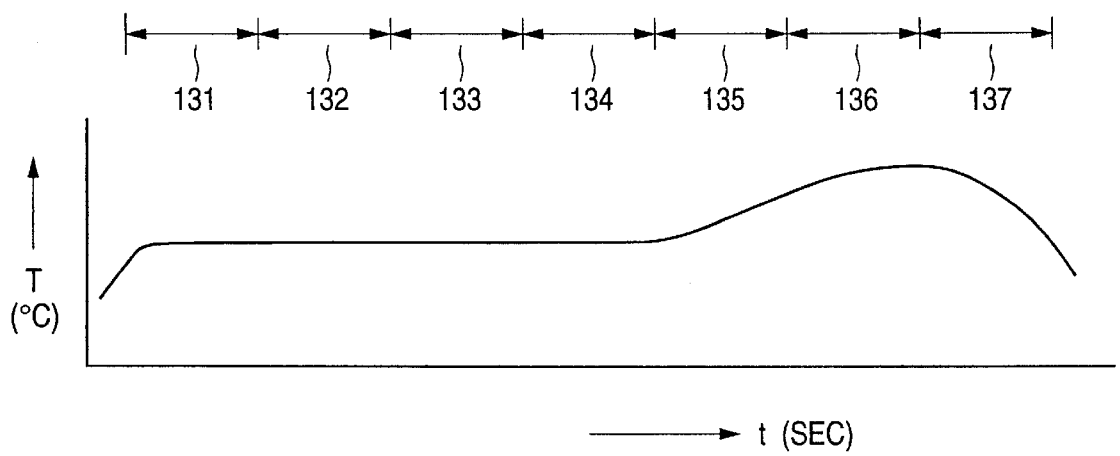
FIG. 14B is a temperature distribution chart in the reflow furnace in the second embodiment of the invention.

FIG. 14A is a side view of the reflow furnace in the second embodiment and FIG. 14B is a temperature distribution chart in the reflow furnace. In FIG. 14A, numerals 121–127 are the thermal furnaces making up the reflow furnace previously described with reference to FIG. 10; the seven thermal furnaces 121–127 are connected in series for making up the reflow furnace. Numeral 113 is a conveyor as transporting unit on which an electronic unit (not shown) placed on a pallet (not shown) is transported. Numeral 111 is a heater. Three heaters 111 are installed in one thermal furnace 121. Numeral 115 is a duct. The ducts 115 are placed facing the heaters 111 with the conveyor 113 between them.

The whole length of the reflow furnace is about 6500 mm and the speed of the conveyor 113 is about 1.4 m per minute. The reflow furnace temperature distribution is as shown in FIG. 14B. That is, in FIG. 14B, vertical axis T is temperature (centigrade) and horizontal axis t is time (seconds). Temperature is raised for preheating an electronic unit 114 at time 131 which the electronic unit passes through the thermal furnace 121. Next, the preheating temperature is held at time 132 through time 133 to time 134 which the electronic unit passes through the thermal furnaces 122–124. At time 135 to time 136 which the electronic unit passes through the thermal furnaces 125 and 126, the temperature on the side of a printed-circuit board (not shown) where chip parts are placed is set to high temperature and reflow soldering is performed. At this time, the temperature in the thermal furnaces is maintained so that the performance of deformed parts (an electrolytic capacitor, an IFT transformer, etc.,) easily affected by temperature, placed on the opposite side of the printed-circuit board is maintained, protecting the deformed parts. Then, in the thermal furnace 127 used for soldering of an input terminal (connector) placed on the frame of the electronic unit, the input terminal is soldered to the frame during time 137. Numeral 138 is a cooling fan for cooling the electronic unit flowing out from 15 the reflow furnace.

For the electronic unit thus reflow-soldered, manual solder correction work in the later process is extremely lessened (to about ¹⁄₄₀) as compared with the electronic unit dip-soldered by the conventional method. Good soldering quality can be clearly understood simply by seeing the finished state.

(Third embodiment)

Figure 15:
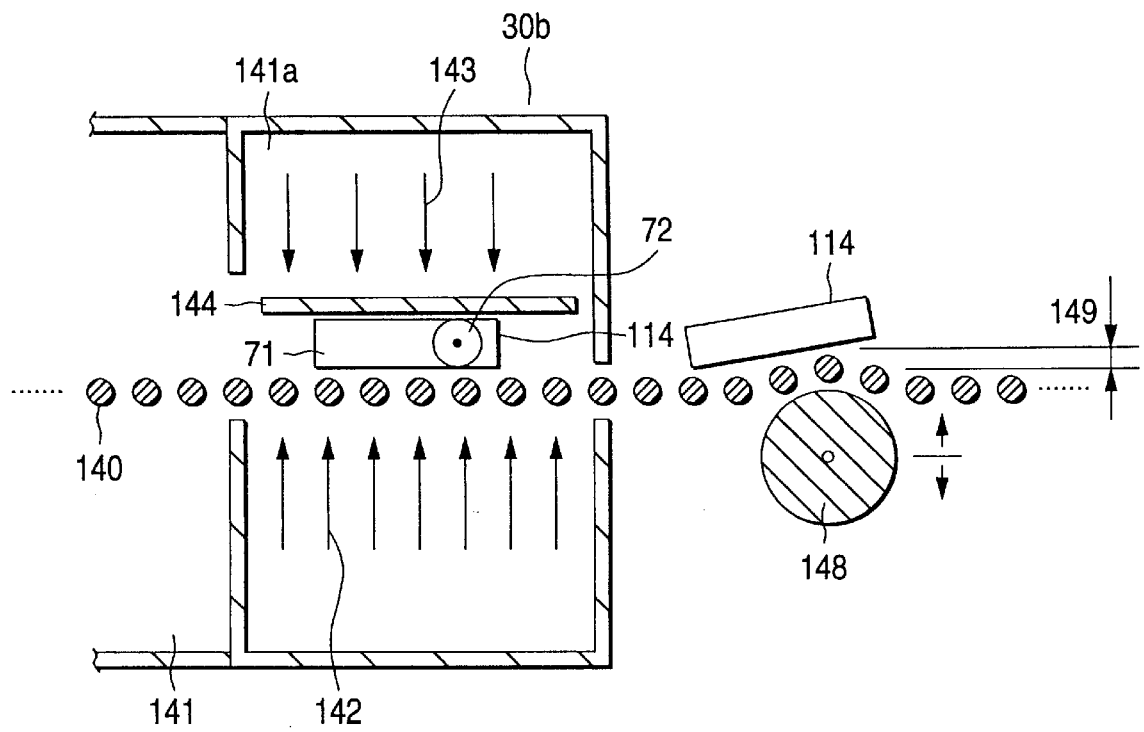
FIG. 15 is a sectional view of the main part of a reflow furnace in a third embodiment of the invention.
Figure 16:
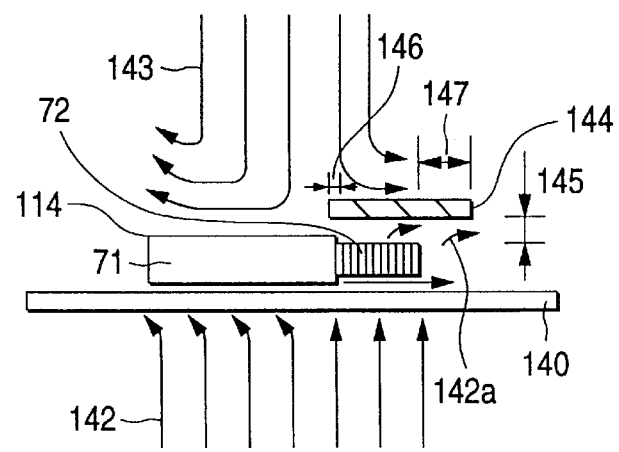
FIG. 16 is a sectional view of the main part of the reflow furnace in the third embodiment of the invention from a different aspect.
Figure 17:
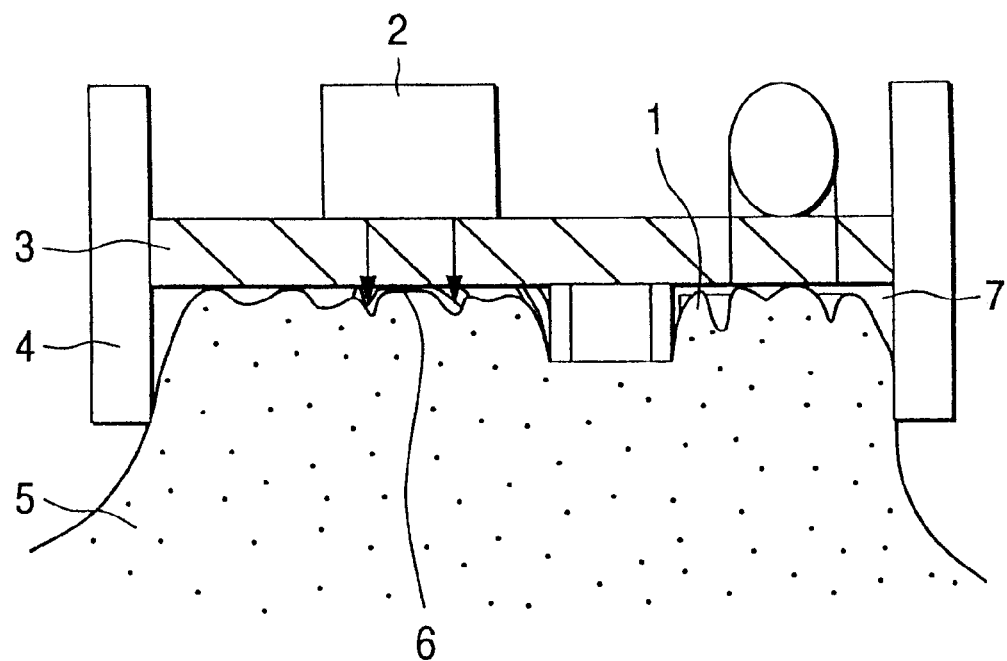
FIG. 17 is a sectional view of the main part of a conventional electronic unit soldering apparatus.

FIG. 15 is a sectional view of the main part of a reflow furnace 30*b* in a third embodiment of the invention. In the figure, numeral 140 is a net conveyor provided penetrating the reflow furnace 30*b*. An electronic unit 114 is placed on the net conveyor 140 and is transported. The reflow furnace 30*b* is separated into a plurality of furnaces 141. In the furnaces 141, temperature is raised for preheating an electronic unit 114 from 100 degrees to 160 degrees in accordance with the flow of the net conveyor 140 and subsequently the preheating temperature is held for about 90 seconds, as described in the first and second embodiments. In the last furnace 141*a*, the electronic unit 114 is heated to 200 degrees or more for about 20 seconds and is reflow-soldered. Numeral 142 is hot air circulated by convection from the bottom of the furnace 141*a* to the net conveyor 140 and numeral 143 is cold air circulated by convection from the top of the furnace 141*a* to the net conveyor 140.

The hot air 142 and cold air 143 are thus circulated by convection, whereby they are separated in the proximity of the net conveyor 140. Therefore, the need for a pallet for separating the hot air 142 and cold air 143 is eliminated.

Numeral 144 is a shielding plate for shielding the cold air 143 from direct contact with an input terminal 72 (used as an example of a connection terminal) placed on a frame 71 of the electronic unit 114. The shielding plate 144 is provided only in the furnace 141*a* at the last position of the reflow furnace 30*b* so that heat of the input terminal 72 of an F-shaped connector having a large heat capacity is not taken due to the cold air 143. Thus, the input terminal 72 is reflow-soldered to the frame 71 by heat of the hot air 142. 16 is a sectional view of the furnace 141*a* from a different direction. The shielding plate 144 is formed of a stainless material having 2–3 mm thickness so that it is not rusted if the shielding plate 144 is placed in the hot air 142. The shielding plate 144 is disposed at a position about 3 mm apart from the top of the electronic unit 114. As this dimension 145, about 3–15 mm is proper. The shielding plate 144 enters about 2 mm toward a frame 71 side 146 of the input terminal 72 and projects about 30 mm to a tip side 147 of the input terminal 72. The shielding plate 144 is thus disposed, whereby the hot air 142 flows around the input terminal 72 as indicated by 142*a* and the input terminal 72 is reflow-soldered.

In FIG. 15, numeral 148 is a roller disposed below the net conveyor 140 at an exit of the reflow furnace 30*b*. The roller 148 is adapted to lift up the net conveyor 140 by a minute distance 149 to peel off the electronic unit 114 stuck on the net conveyor 140 therefrom. The roller 148 is disposed so that it can be adjusted 5–10 mm up and down by screw tightening.

Thus, the electronic unit soldering apparatus is constructed by the net conveyor 140 for transporting the electronic unit 114 and a reflow furnace 30b through which the net conveyor 140 on which the electronic unit 114 is placed passes with the cold air 143 circulated by convection above the net conveyor 140 and the hot air 142 circulated by convection below the net conveyor 140. The reflow furnace 30b is provided with the shielding plate 144 for shutting off the cold air 143 above the input terminal 72 disposed in the frame 71 of the electronic unit 114. Therefore, the temperature on the non-heat-resistant part side is cooled by the cold air 143, thus the non-heat-resistant parts are protected and further reflow soldering can be executed; the soldering quality becomes good and correction work is drastically reduced.

The hot air 142 and the cold air 143 are circulated by convection, thereby eliminating the need for a pallet; the electronic unit 114 is placed directly on the conveyor 140 of transporting unit and an improvement in workability and cost reduction are enabled.

Further, the shielding plate 144 enables the input terminal 72 of the electronic unit 114 to be soldered in the reflow furnace 30b.

The electronic unit 114 is separated from the net conveyor 140 by the roller 148. Thus, even if the electronic unit 114 is stuck on the net conveyor 140 with paste, etc., adhering to the net conveyor 140, the electronic unit 114 is separated and workability is improved.

Further, the separation degree of the electronic unit 114 from the net conveyor 140 by the roller 148 can be adjusted to an optimum value in response to the size of the electronic unit 114.

[Advantages of the Invention]

According to the invention, there is provided an electronic unit soldering apparatus including transporting unit, a pallet on which an electronic unit to be reflow-soldered is placed, the pallet transported on the transporting unit, and a reflow furnace through which the pallet passes, the reflow furnace having an air heating furnace for heating the side of a printed-circuit board where heat-resistant parts are placed and an air cooling furnace for cooling the side of the printed-circuit board where non-heat-resistant parts are placed, the electronic unit being placed below the pallet with the non-heat-resistant part insertion side of the printed-circuit board up, the air cooling furnace being disposed above the pallet, the pallet being formed with holes through which cold air passes at the positions corresponding to the non-heat-resistant part placement positions as a mask pallet, wherein the printed-circuit board placed on the electronic unit is preheated for a predetermined time, then is set to a cream solder fusing temperature or more and the temperature on the side of the non-heat-resistant parts placed on the surface of the printed-circuit board is set lower than the temperature on the side of the face-mounted parts of the heat-resistant parts placed on the rear face of the printed-circuit board. Only the non-heat-resistant parts are cooled by cold air for protection and other portions are less affected by cold air owing to the mask pallet. Thus, the non-heat-resistant parts are protected and reflow soldering can be executed; good soldering quality is provided for drastically lessening correction work.

Since the air heating and cooling furnaces are disposed separately, temperature setting is facilitated.

Further, the mask pallet is disposed above a deformed shaped part having large heat conductivity or a large heat capacity placed on the surface of the printed-circuit board so as to block cold air. Since the mask pallet for blocking cold air is disposed above the part having large heat conductivity, cooling of the face-mounted part side of the printed-circuit board via the part having large heat conductivity is prevented and the soldering quality of the face-mounted part side can be held good.

In addition, the mask pallet is disposed above the frame and the partition plate forming parts of the electronic unit so as to block cold air. Since the mask pallet for blocking cold air is disposed above the frame and the partition plate having large heat conductivity, cooling of the face-mounted part side of the printed-circuit board via the frame and the partition plate having large heat conductivity is prevented and the soldering quality of the face-mounted part side can be held good.

In addition, a gap about 3 mm is provided between the upper end of the frame and the mask pallet. By providing the gap, the mask pallet does not take heat from the frame, a high-heat-conductivity part, and good soldering can be executed.

Moreover, one cold air shielding plate is formed with mask pallets for several electronic units. A number of electronic units can be soldered at a time and productivity is improved.

Further, hot air is set to 420 to 450 degrees and cold air is set to about 90 degrees. The temperatures of the air heating and cooling furnaces are thus set, whereby the non-heat-resistant parts are protected reliably and the soldering quality of the heat-resistant part side of the printed-circuit board can be held good.

In addition, in the reflow furnace, the rear face of the printed-circuit board is preheated from 100 to 160 degrees for about 90 seconds, then is heated to 200 degrees or more for about 20 seconds. The surface temperature of the printed-circuit board is thus set, whereby the non-heat-resistant parts are protected reliably and the soldering quality of the heat-resistant part side of the printed-circuit board can be held good.

Moreover, in the reflow furnace, after the rear face of the printed-circuit board is heated to 200 degrees or more, only the root of the input terminal placed on the frame of the electronic unit is heated by hot air ranging from 230 to 260 degrees. The input terminal placed on the frame can be soldered in the same process.

In addition, the mask pallets are transported continuously in the reflow furnace. Since the air heating and cooling furnaces are separated by the mask pallets, separate temperature control of the air heating and cooling furnaces is facilitated.

According to an another aspect of the invention, there is provided an electronic unit soldering apparatus comprising transporting unit, a pallet on which an electronic unit to be reflow-soldered is placed, the pallet transported on the transporting unit, and a reflow furnace through which the pallet passes, the reflow furnace comprising a heater disposed below the pallet and a heat absorption duct for absorbing hot air of a gap formed between the pallet and the heater, wherein a printed-circuit board placed on the electronic unit is preheated for a predetermined time, then is set to a cream solder fusing temperature or more and temperature on the side of non-heat-resistant parts placed on the surface of the printed-circuit board is set lower than temperature on the side of face-mounted parts of heat-resistant parts placed on the rear face of the printed-circuit board. Since hot air is absorbed by means of the heat absorption duct, the non-heat-resistant parts are protected and reflow soldering can be executed; good soldering quality is provided for drastically lessening correction work.

Because of one furnace, downsizing and cost reduction are enabled.

In addition, in the electronic unit soldering apparatus of the above, holes are made in a bottom of the pallet at positions corresponding to the heat-resistant parts placed on the rear face of the printed-circuit board.

Further, a concave part is formed in the bottom of the pallet, holes are made in the bottom of the concave part at the positions corresponding to the heat-resistant parts placed on the rear face of the printed-circuit board, and the thickness of the material forming the concave part is set to roughly a half of the thickness of the material forming the pallet. The pallet strength is maintained and the concave part does not take reflow heat; good reflow soldering can be executed.

Moreover, the width of the heater is made roughly twice the width of the pallet. Since uniform heater heat is applied to the pallet, good soldering quality is provided.

In addition, in the reflow furnace, the rear face of the printed-circuit board is preheated from 100 to 160 degrees for about 90 seconds, then is heated to 200 degrees or more for about 20 seconds. The surface temperature of the printedcircuit board is thus set, whereby the non-heat-resistant parts are protected reliably and the soldering quality of the heat-resistant part side of the printed-circuit board can be held good.

Further, in the reflow furnace, after the rear face of the printed-circuit board is heated to 200 degrees or more, only the root of the input terminal placed on the frame of the electronic unit is heated by hot air ranging from 230 to 260 degrees. The input terminal placed on the frame can be soldered in the same process.

According to an another aspect of the invention, there is provided an electronic unit soldering apparatus comprising a net conveyor for transporting an electronic unit and a reflow furnace through which the net conveyor on which the electronic unit is placed passes with cold air circulated by convection above the net conveyor and hot air circulated by convection below the net conveyor, the reflow furnace being provided with a shielding plate for shutting off the cold air above an input terminal disposed in a frame of the electronic unit. Since the non-heat-resistant part side is cooled by cold air, the non-heat-resistant parts are protected and reflow soldering can be executed; good soldering quality is provided for drastically lessening correction work.

The hot air and the cold air are circulated by convection, thereby eliminating the need for the pallet; the electronic unit is placed directly on the conveyor of transporting unit and an improvement in workability and cost reduction are enabled.

Further, the shielding plate enables the connection terminal of the electronic unit to be reflow-soldered in the reflow furnace.

In addition, the above electronic unit soldering apparatus further may include separation unit for separating the net conveyor and the electronic unit. Even if the electronic unit is stuck on the net conveyor with paste, etc., adhering to the electronic unit, it is separated by the separation unit and workability is improved.

Further, in the above electronic unit soldering apparatus, the separation degree of the separation unit can be adjusted. The separation degree can be adjusted to an optimum value in response to the size of the electronic unit.

What is claimed is:

1. An electronic unit soldering apparatus comprising:

a net conveyor for transporting an electronic unit;

a reflow furnace through which said net conveyor having the electronic unit passes with cold air circulated by convection above said net conveyor and hot air circulated by convection below said net conveyor, said reflow furnace having a shielding plate for shutting off the cold air above a connecting terminal disposed in a frame of the electronic unit; and a separation unit for separating said net conveyor and the electronic unit.

2. The electronic unit soldering apparatus as claimed in claim 1, wherein the degree of separation of said separation unit can be adjusted.

3. An apparatus for soldering an electronic unit including a printed-circuit board having a first surface upon which a non-heat-resistant part is mounted, and an opposite second surface upon which a heat-resistant part is mounted, said apparatus comprising:

a net conveyor upon which the electronic unit is disposed such that the heat-resistant part is disposed adjacent to the net conveyor;

a reflow furnace through which said net conveyor with the electronic unit passes, said reflow furnace including at least one lower temperature furnace, wherein said electronic unit is preheated for a predetermined time, and a higher temperature furnace, wherein said heat-resistant part is re-flow soldered, said higher temperature furnace having cold air circulated by convection above said net conveyor and hot air circulated by convection below said net conveyor, said higher temperature furnace including a shielding plate spaced above the electronic unit and having at least one end spaced horizontally from the electronic unit, such that the cold air is shielded from the heat-resistant part and hot air flows around the heat-resistant part.

4. The apparatus of claim 3, wherein the heat-resistant part is a connection terminal.

5. The apparatus of claim 3, wherein the electronic unit is disposed directly on the net conveyor.

6. The apparatus of claim 3, wherein in the higher temperature furnace, the temperature of the first surface of the electronic unit has a lower temperature than the second side of the electronic unit.

7. The apparatus of claim 3, wherein the shielding plate has a hole in the vicinity of a portion corresponding to the non-heat-resistant part, such that the cold air flows around the non-heat-resistant part for protecting the non-heat-resistant part.

* * * * *

UNITED STATES PATENT AND TRADEMARK OFFICE
CERTIFICATE OF CORRECTION

PATENT NO.   : 6,123,247
DATED        : September 26, 2000
INVENTOR(S)  : Shibo et al.

It is certified that error appears in the above-indentified patent and that said Letters Patent is hereby corrected as shown below:

On Title Page, Section [56], References Cited, delete "4,651,401", and insert therefor --4,951,401--.

Column 6, line 10, delete "15".

Column 6, line 48, before "16", insert --FIG.--.

Column 7, line 1, delete "-electronic", and insert therefor --electronic--.

Column 9, lines 22-23, delete "print-edcircuit", and insert therefor --printed circuit--.

Signed and Sealed this

Twenty-ninth Day of May, 2001

Attest:

NICHOLAS P. GODICI

*Attesting Officer*       *Acting Director of the United States Patent and Trademark Office*